United States Patent [19]
Berggren et al.

[11] Patent Number: 5,881,089
[45] Date of Patent: Mar. 9, 1999

[54] ARTICLE COMPRISING AN ORGANIC LASER

[75] Inventors: Magnus Berggren, Murray Hill; Ananth Dodabalapur, Millington; Richart Elliott Slusher, Lebanon, all of N.J.

[73] Assignee: Lucent Technologies Inc., Murray Hill, N.J.

[21] Appl. No.: 855,046

[22] Filed: May 13, 1997

[51] Int. Cl.$^6$ ................. H01S 3/30; H01S 3/08; G02B 6/10; G02B 6/00
[52] U.S. Cl. ................. 372/96; 372/7; 385/143; 385/130
[58] Field of Search ................. 372/5, 7, 67, 96, 372/102; 385/129, 130, 131, 143, 145; 257/40

[56] References Cited

U.S. PATENT DOCUMENTS

| | | | |
|---|---|---|---|
| 4,464,762 | 8/1984 | Furuya | 385/131 |
| 5,220,573 | 6/1993 | Sakata et al. | 372/96 |
| 5,478,658 | 12/1995 | Dodabalapur et al. | 372/41 |
| 5,674,636 | 10/1997 | Dodabalapur et al. | 372/41 |
| 5,682,402 | 10/1997 | Nakayama et al. | 372/7 |
| 5,732,102 | 3/1998 | Bouadma | 372/96 |
| 5,780,174 | 7/1998 | Tokito et al. | 372/99 |

Primary Examiner—Rodney Bovernick
Assistant Examiner—Quyen Leung
Attorney, Agent, or Firm—Eugen E. Pacher

[57] ABSTRACT

An organic laser according to the invention comprises an electrically pumped source of incoherent radiation with organic active region, and further comprises a waveguide structure that receives the incoherent radiation. The core of the waveguide comprises organic material that absorbs the incoherent radiation and emits coherent radiation of longer wavelength. The laser forms a unitary structure, with the source of incoherent radiation being close to the waveguide core, exemplarily less than $10\lambda$ from the core, where $\lambda$ is the laser wavelength. Exemplarily the laser is embodied in a planar waveguide laser, in a microdisk laser, or in a laser comprising a photonic bandgap structure.

13 Claims, 4 Drawing Sheets

ARTICLE COMPRISING AN ORGANIC LASER

FIELD OF THE INVENTION

This invention pertains to solid state lasers. More particularly, it pertains to solid state lasers that have organic material in their active region.

BACKGROUND

A number of conventional solid state lasers are based on inorganic semiconductors (e.g., GaAs) and typically are electrically driven. That is to say, the lasers (generally referred to as diode lasers) utilize recombination of injected electrons and holes in a laser cavity. This necessitates a design which has to meet both electrical and optical requirements. The requirements are relatively easily met in the case of inorganic semiconductors, where high carrier mobility allows utilization of relatively thick layers without too large penalties in terms of voltage drop and ohmic losses. Furthermore, the availability of closely related semiconductor materials with significant difference in refractive index facilitates easy fabrication of planar waveguides or distributed Bragg reflector-based vertical cavity lasers. These favorable properties have led to the rapid evolution of inorganic semiconductor lasers. For background on semiconductor lasers, see for instance, G. P. Agrawal et al., "Long-Wavelength Semiconductor Lasers", Van Nostrand Reinhold, New York 1986.

Despite the widespread use of inorganic semiconductor diode lasers, it would be of interest to have available lasers based on organic materials, since at least some organic materials have properties which could make them suitable as, for instance, gain media in very low threshold lasers. These properties include a Stokes shift between the absorption and emission bands, and the ability to easily realize guest-host systems in which a small volume fraction of the emitting species is embedded in a suitable host. However, while it is possible to realize low threshold organic lasers by optical pumping with radiation from a suitable external source (see, for instance, M. Kuwata-Gonokami et al., *Optics Letters,* Vol. 20 (20), p. 2093 (1995)), a number of factors have, to the best of our knowledge, so far prevented successful design of an electrically pumped organic laser. On the other hand, electrically pumped lasers generally are more convenient than optically pumped lasers. For instance, electrically pumped semiconductor lasers are generally more compact and easier to modulate than optically pumped semiconductor lasers. Thus, it would be desirable to have available organic lasers that do not require exposure of the laser to externally-created pump radiation.

By "conventional" electrical pumping we mean herein pumping by injection of electrons and holes into a diode structure, with recombination in a substantially undoped active region.

Regarding the use of organic materials in electrically pumped lasers, there are a number of difficulties that would have to be overcome. Among these are the very low carrier mobility in relevant materials, and the present unavailability of suitable combinations of materials with appropriately large refractive index difference and requisite carrier transport properties. These difficulties for instance make the design of a low-loss cavity (a prerequisite for low threshold lasing) a formidable task.

SUMMARY OF THE INVENTION

We have come to realize that most, if not all, of the potential benefits of an electrically pumped organic laser can be realized in a novel structure that does not utilize conventional electrical pumping. That is to say, we have come to realize that injected electrical power can be efficiently converted to stimulated optical emission in a unitary device structure that in a first region converts, in an organic light source, an electrical current into incoherent photons, with the incoherent photons coupled into a second region which comprises the laser cavity. The laser cavity can be designed to efficiently absorb the optical pump power, exhibit low optical losses and high optical gain. The two regions are preferably in close proximity to each other (exemplarily <10λ separation, where λ is the laser wavelength) such that a compact unitary device is achieved. Exemplary device structures are described below.

More specifically, the invention is embodied in an article that comprises a unitary solid state source of electromagnetic radiation (frequently to be referred to as "light", regardless of wavelength). The source comprises a layer structure that comprises a multiplicity of layers, including two spaced apart conductor layers with light-emissive first organic material therebetween, and further comprises contacts for causing an electrical current to flow between said conductor layers, such that incoherent electromagnetic radiation of a first wavelength (frequently a range of wavelengths) is emitted from said light-emissive first organic material.

Significantly, the layer structure further comprises an optical waveguide comprising a first and a second cladding region, with a core region therebetween. The optical waveguide is disposed such that at least some of said incoherent electromagnetic radiation of the first wavelength is received by the optical waveguide. The core region comprises a layer of second organic material selected to absorb said incoherent electromagnetic radiation of the first wavelength, and to emit coherent electromagnetic radiation of a second wavelength in response to said absorbed incoherent electromagnetic radiation of the first wavelength. The second wavelength is longer than the first wavelength, and the optical waveguide is selected to guide at least electromagnetic radiation of the second wavelength. The optical waveguide exemplarily but not necessarily is disposed between the two conductor layers.

By a "unitary" solid state source we mean a solid state source wherein the relative position of the first organic material layer with respect to the optical waveguide is permanently fixed, with the optical waveguide being close to (exemplarily within about 10λ, where λ is the second wavelength, i.e., the laser wavelength) to the first organic material layer. Typically the source is fixedly disposed on a substrate.

By a "solid state" source we mean a source that, at the operating temperature, consists only of solid material (as opposed to liquid or gaseous material). The term does not imply crystallinity, and solid state sources according to our invention may comprise amorphous, polycrystalline and/or single crystal layers.

The term "organic material" is used herein in conventional manner, to refer to carbon- and hydrogen-containing compounds, and includes polymers, oligomers and small molecules.

DETAILED DESCRIPTION

Figure 1:
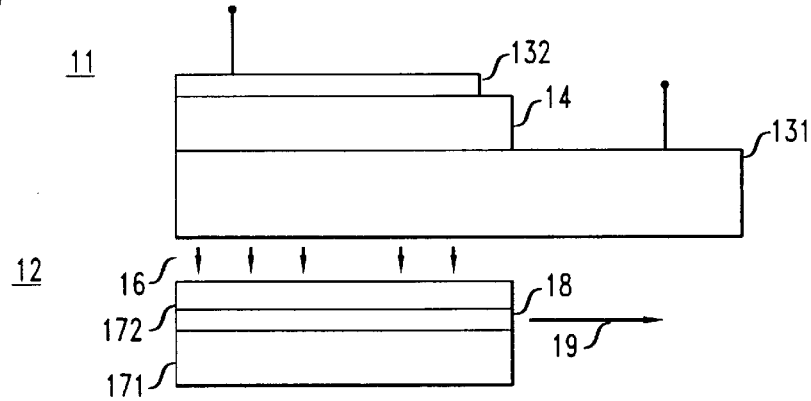
FIG. 1 schematically illustrates the principle of lasers according to the invention.

FIG. 1 schematically illustrates the principle of a solid state source of coherent electromagnetic radiation according to the invention. Numerals 11 and 12 refer, respectively, to the first and second regions of the layer structure of the device. They are shown physically separated for tutorial reasons, but in actual embodiments the layer structure will be a unitary structure, typically a sequential structure, as is discussed below. Side-by-side unitary structures are possible at least in principle and are not precluded.

The first region 11 comprises (semi-transparent) conductor 131 (e.g., indium tin oxide, ITO), light emissive organic layer 14 (e.g., 30 nm Alq and 30 nm TAD), and conductor layer 132. The former serves as the anode, the latter as the cathode. Those skilled in the art will recognize the first region to constitute an organic light emitting diode (LED). "Alq" is conventional for 8-hydroxyquinolinato aluminum, and "TAD" is conventional for triphenyl/diamine.

The first region 11 is optically coupled to the second region 12, with incoherent radiation 16 transmitted into the second region. The second region constitutes a laser cavity comprising cladding layers 171 and 172, with core region 18 therebetween. As is well known, the core region has higher refractive index than the cladding layers to provide light guiding. Arrow 19 designates the coherent radiation emitted from the laser cavity. Layers 171, 18 and/or 172 can be patterned by conventional means if desired.

Organic LEDs are known and can be made to have very high quantum efficiencies. External quantum efficiencies >2% are commonly reported. This typically corresponds to internal quantum efficiencies >10%. By internal quantum efficiency we mean the fraction of injected electrons which are converted to photons, and by external quantum efficiency we mean the ratio of photons exiting a device to the electrons injected into the device.

It is possible, by means of careful engineering of the layers of an organic LED, to inject large current densities into the device. We have injected >100 A/cm² of current under pulsed conditions into organic LEDs based on Alq emissive layers. For example, a current density of 110 A/cm² was passed through a device with 30 nm TAD and 30 nm Alq under pulsed excitation (pulse width 1 μs). The TAD functioned as the hole transporting layer and the Alq as the electron transporting and emissive layer. The operation of such organic LEDs is described by C. W. Tang et al., *J. Applied Physics*, Vol. 65, p. 3610 (1989). Assuming a 5–10% internal quantum yield, the above conditions correspond to about 10 W/cm² of optical power generated at the emitting layer.

The high output optical powers realizable with efficiently designed organic LEDs can be efficiently coupled to a separately optimized laser cavity, as will now be described.

As mentioned above, light generated in the first region 11 of the device according to the invention is injected into the second region 12 where it must be absorbed and converted to photons of longer wavelength. The optical gain in the second region must be sufficient to overcome the losses and give rise to stimulated emission from the second region. This can be achieved by means of a variety of organic materials and/or cavity architectures.

Stimulated emission and lasing have been observed in a variety of organic media. Indeed, organic gain media were used in the first demonstrations of distributed feedback (DFB) lasers (see H. Kogelnik et al., *Applied Physics Letters*, Vol. 18 (4), p. 152, 1971), and distributed Bragg reflector (DBR) lasers (see I. P. Kaminow et al, *Applied Physics Letters*, Vol. 18 (11), p. 497, 1971). The gain medium of prior art (optically pumped) organic lasers typically consists of a transparent polymer host doped with fluorescent dye molecules. The host functions to keep the dopant molecules spatially separated so that concentration quenching can be minimized.

Among possible cavity architectures are planar waveguides, whispering gallery mode microdisks, and vertical cavities. We will now provide a description of an exemplary process of making a device according to the invention, namely, a device with planar waveguide with DFB.

Figure 2:
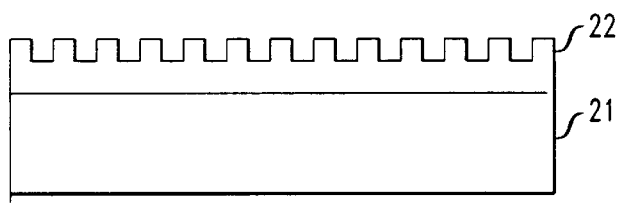
FIGS. 2–4 schematically depict an exemplary laser according to the invention at various stages of manufacture.

A silicon wafer is coated with $SiO_2$ in conventional fashion (e.g., CVD). The $SiO_2$ layer typically is 1–2 μm thick. A grating is formed in the $SiO_2$ layer in conventional manner (photolithography and etching, e.g., plasma etching in $CHF_3$). The grating period Λ depends on the design wavelength λ in known manner, namely, $\Lambda=\lambda/2n_{eff}$, where $n_{eff}$ is the effective refractive index. Etching exemplarily proceeds until a grating depth of ~30 nm is achieved. This is followed by removal of the photoresist. The resulting intermediate product is schematically shown in FIG. 2, with numerals 21 and 22 referring to the silicon substrate and the patterned $SiO_2$ layer, respectively.

Figure 3:
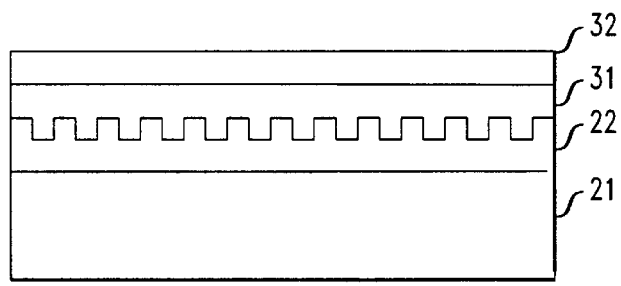

Next a 250 nm thick patterned layer of Alq doped with about 1% b.v. DCM2 (a laser dye available, for instance, from Exciton, Inc., Dayton, Ohio) is deposited over the grating by co-evaporation through the 25×1000 μm openings of a mechanical shadow mask. This is followed by deposition (by sublimation) of about 1 μm of $MgF_2$ over the surface. See FIG. 3, wherein numerals 31 and 32 refer to the doped Alq layer and the $MgF_2$ layer, respectively.

Those skilled in the art will recognize that the $SiO_2$/doped Alq/$MgF_2$ layer sequence forms a planar waveguide, since the refractive indices are about 1.47, 1.65 and 1.4, respectively. The lateral extent and length of the waveguide (and thus of the optical cavity) are defined by the patterned doped Alq.

Onto the thus formed second region of the device is deposited a layer of semi-transparent conductor, e.g., sputter deposition of about 100 nm of ITO, sheet resistance <10 Ohms/square. Optionally a dielectric layer (e.g., SiO) is placed between the $MgF_2$ and the ITO.

Figure 4:
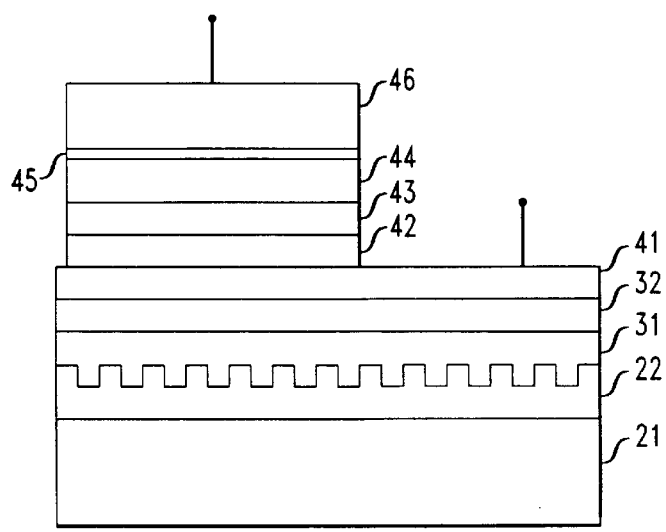

By vacuum sublimation, the following layers are deposited in sequence through a mechanical shadow mask, with apertures dimensioned such that a part of the ITO layer remains exposed: 30 nm TAD, 15 nm NAPOXA, 15 nm Alq. "NAPOXA" stands for 2-naphtyl-4,5-bis(4-methoxyphenyl)-1,3-oxazole. For synthesis information see, for instance, U.S. patent application Ser. No. 08/673,864, filed Sep. 13, 1995 by A. Dodabalapur et al. Finally, through the above referred to shadow mask are deposited 2 nm lithium and 250 nm aluminum. The resulting structure is schematically depicted in FIG. 4, wherein numerals 41–46 refer, respectively, the ITO, TAD, NAPOXA, Alq, Li and Al layers. The Li/Al layer serves as the cathode and the ITO layer serves as the anode of the organic LED (the first region).

Application of a suitable voltage between anode and cathode causes current flow in the external circuit, hole injection from the ITO to the TAD, and electron injection from the Li/Al electrode to the Alq and from there into the NAPOXA layer. Carrier re-combination occurs in the NAPOXA, leading to the emission of photons over a wavelength range that includes the range 400–450 nm. At least a portion of this incoherent radiation is coupled into the waveguide of the second region 12, where it is absorbed by the Alq, with the thus generated excitations Forster-transferred to the dopant (the DCM dye), followed by photon emission by stimulated emission and lasing. Those skilled in the art are familiar with the concept of Forster transfer of molecular excitations. The grating serves as a wavelength-selective feature. It is disposed such that an optical mode in the optical waveguide interacts with the grating.

Figure 5:
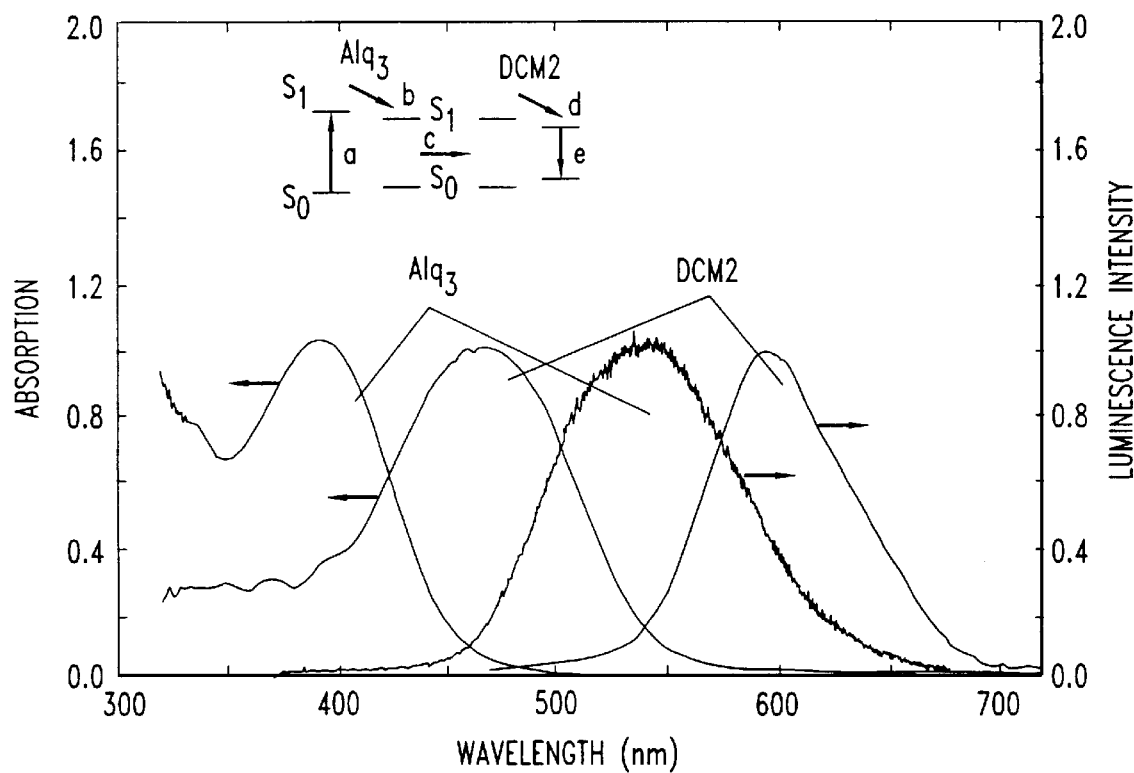
FIG. 5 shows absorption and luminescence data of exemplary organic materials useful in the practice of the invention.

FIG. 5 shows absorption and luminescence data for Alq and DCM 2.

Optionally a wavelength filter is disposed between regions 11 and 12 to prevent entry into the laser cavity of radiation that is not efficiently absorbed by the Alq.

The thus produced electrically pumped organic laser is tested and is found to perform as expected, emitting coherent radiation of approximate wavelength 620 nm. More specifically, upon application of a suitable voltage between the cathode and the ITO anode, a current flows in the external circuit, and holes are injected from the ITO to the TAD, while electrons are injected from the cathode into the Alq and therefrom into the NAPOXA layer. Carrier re-combination occurs in the NAPOXA, leading to the emission of a significant number of photons in the wavelength range 400–450 nm. These photons can be absorbed by the Alq in region 2, i.e., the Alq in the optical cavity. The excitations generated in the Alq by the absorbed light are Forster-transferred to the DCM dye. Wavelengths longer than about 450 nm are emitted by region 1, i.e. the diode structure, but are not efficiently absorbed in the optical cavity, as can be seen from FIG. 5. The excitations in the DCM dye can decay by a process that involves emission of a photon. If sufficient current is injected into the diode structure, the optical power transferred to the DCM dye is sufficient to achieve laser action, resulting in emission of coherent radiation in response to the electrical input.

It will be understood that the above described DFB device is exemplary only, and that, for instance, the recited layer compositions and thicknesses can be varied if desired, without departure from the spirit of our invention. It will also be understood that lasers according to the invention are not necessarily DFB lasers but could, for instance, be DBR (distributed Bragg reflector) lasers. Furthermore, lasers according to the invention could comprise organic active material in a cavity that is based on the photonic bandgap concept. For background on the photonic bandgap concept see, for instance, "Solid State Physics", Vol. 49, pp. 151–203, Academic Press, San Diego (1995), H. Ehrenreich and F. Spaepen.

Figure 10:
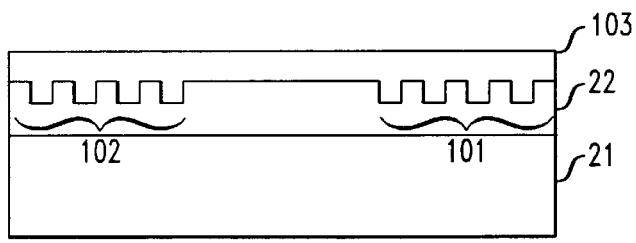
FIG. 10 schematically depicts a DBR laser according to the invention.

FIG. 10 schematically depicts a relevant portion of a DBR laser according to the invention, wherein numerals 21 and 22 refer to the substrate (e.g., a Si wafer) and the lower cladding layer (e.g., $SiO_2$), respectively. Numerals 101 and 102 refer to the spaced apart reflectors that define the laser cavity, and numeral 103 refers to the organic material core. The reflectors exemplarily are gratings. The upper cladding region and the layer structure can be substantially as shown in FIG. 4 and are not shown.

Figure 11:
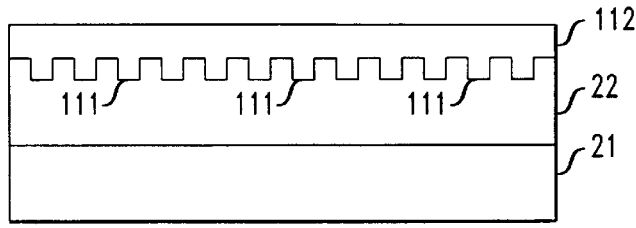
FIGS. 11 and 12 schematically show a photonic bandgap laser according to the invention.
Figure 12:
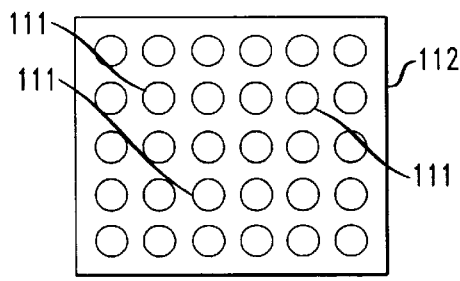

FIG. 11 schematically shows a relevant portion of a photonic bandgap laser according to the invention, wherein numerals 21, 22 and 112 refer, respectively, to the substrate, the lower cladding layer and the organic material core region. Features 111 exemplarily are depressions (but could be raised features) in the cladding layer. As can be seen from FIG. 12, the depressions 111 form a regular array. The details of the array (e.g., diameter and depth of the depressions, center-to-center spacing of the depressions) determine the photonic bandgap properties of the array. It will be understood that FIGS. 11 and 12 represent a side view and plan view, respectively.

Figure 6:
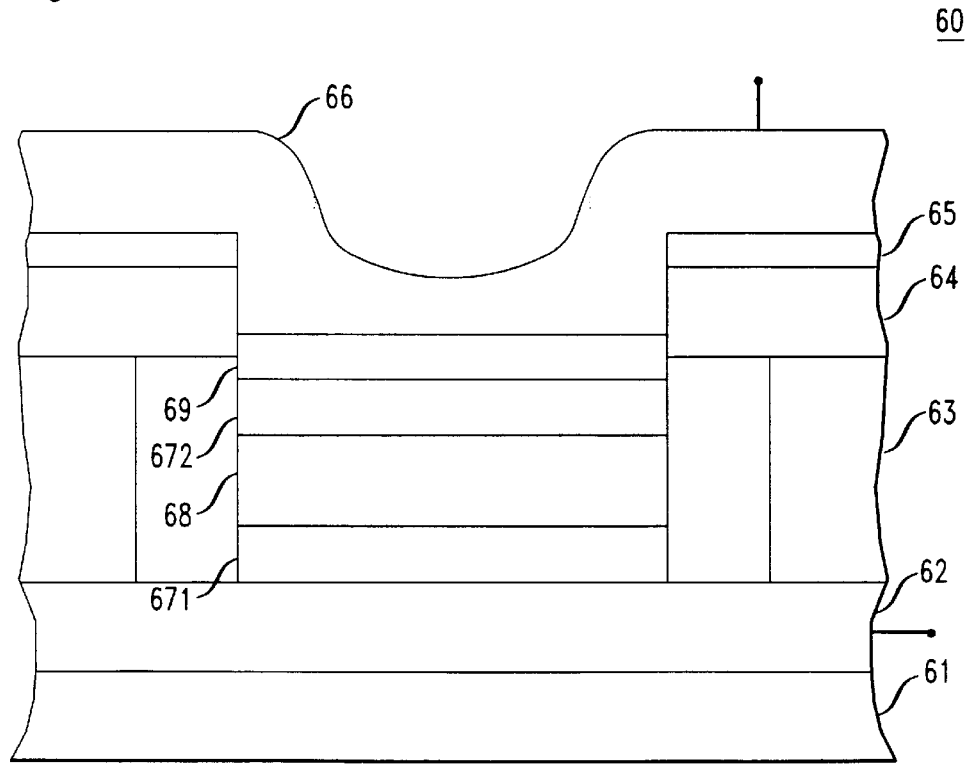
FIGS. 6–8 schematically show further exemplary embodiments of the invention.

In the above discussed exemplary device, regions 11 and 12 are electrically separate and optically coupled. However, electrical separation is not a necessary feature, as will now be demonstrated by means of further exemplary devices according to the invention. The first of these is schematically depicted in FIG. 6. The laser is a "microdisk" laser, and thus is substantially circularly symmetric. See, for instance, S. L. McCall et al, *Applied Physics Letters*, Vol. 60 (3), p.291 (1992).

Organic laser 60 comprises a glass substrate 61, with ITO layer 62 thereon. Gold layer 63 surrounds the stack of organic layers, and is covered by $SiO_2$ layer 64. Numerals 671, 68, 672 and 69 refer, respectively, to a TAD layer, a PTCDA layer doped with Pentacene, a TAD layer and a Alq layer. PTCDA is available, for instance, from Aldrich Chemical Company, Inc., Milwaukee, Wis. The same stack of organic layers (designated 65) is disposed on the $SiO_2$ layer. This is an artifact of the manufacturing process. Stack 65 does not play a role in device operation and could be removed, if desired. Aluminum electrode 66 provides electrical contact to top Alq layer 69.

The device 60 can be produced as follows. On substrate 61 (e.g., glass or any other suitable transparent material) is deposited a 150 nm ITO layer, followed by deposition of a 300 nm gold layer. By plasma enhanced CVD (or any other suitable technique), a 250 nm layer of $SiO_2$ is deposited on the gold. Photoresist is spun on the $SiO_2$, and circular windows of diameter typically in the range 1–10 $\mu$m, are photolithographically defined in the photoresist. The exposed $SiO_2$ is dry-etched in a conventional plasma (e.g., containing $CHF_3$ at 50 mTorr, 250V). After removal of the exposed $SiO_2$, the exposed gold is removed by chemical etching (e.g., $KI:I_2:H_2O$; this etch does not attack $SiO_2$ or ITO). The etch does form an undercut, with the undercut providing isolation of the subsequently formed stack of organic materials from the surrounding gold. After cleaning (de-ionized water, oxygen-containing plasma) of the thus produced structure, the organic materials are deposited by sublimation. Deposition of 200 nm TAD is followed by co-deposition of 200 nm of perylenetetracarboxylic dianhydride (PTCDA) with about 1% b.v. pentacene (a laser dye available, for instance from Aldrich Chemical Company, Inc). This is followed by deposition of 200 nm TAD, which in turn is followed by deposition of 50 nm Alq. The device structure is completed by deposition of 400 nm of Al. If desired, the final portion of the Al deposition can be by angle deposition so as to insure electrical continuity.

It will be appreciated that the above method and device are exemplary, and that layer compositions and thicknesses could be changed, if desired.

TAD has a lower refractive index than PTCDA, the above described organic stack thus forms a waveguide. An important property of these materials is that both core and cladding material have the ability to transport charges (holes), such that holes, injected into the lower TAD layer by the ITO electrode, can be transported to the TAD/Alq interface where they combine with electrons that are injected into the Alq layer by the Al electrode and have been transported to the interface, resulting in photon emission. These photons are absorbed by the PTCDA, and the resulting excitation is transferred to the dye dopant (exemplarily pentacene). The dye dopant then emits photons, which are confined by the disk waveguide. The thus formed optical cavity supports so-called "whispering gallery" modes which skim the periphery of the waveguide disk.

The laser light is emitted from the waveguide along the plane of the waveguide. It is reflected from the gold and aluminum, and ultimately exits the device through the back of the glass body. Of course, some of the light will be absorbed by the gold and other layers.

Figure 7:
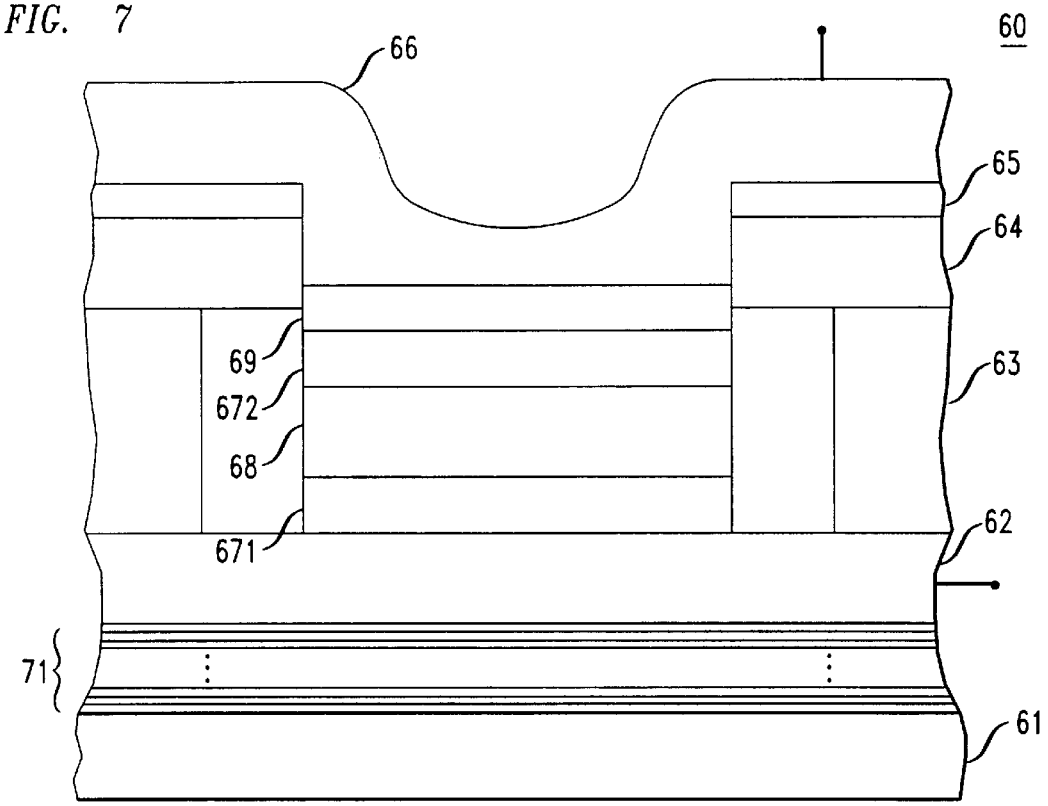

FIG. 7 shows electrical and luminescence data for a diode having a layer structure similar to the above described structure, namely, ITO/100 nm TAD/200 nm PTCDA/10 nm TAD/70 nm Alq:DCM2/Al. The data clearly establish that the layer structure emits light under appropriate bias voltage.

FIG. 7 schematically shows another exemplary embodiment of the invention. The laser of FIG. 7 substantially resembles the laser of FIG. 6, except that the former has a transparent dielectric multilayer stack 71 disposed between substrate 61 and ITO layer 62. Such a stack typically consists of alternating layers of material (e.g., $SiO_2$ and $SiN_x$) that differ from each other with respect to refractive index. The layers typically (but not necessarily) are selected such that each layer is approximately of thickness $\lambda/4$, where $\lambda$ is the wavelength of the laser. The multilayer stack can function to change the shape of the optical mode in the waveguide (671/68/672), and thereby improve laser performance. Quarter wave stacks are well known and have been used in organic LEDs. See, for instance, A. Dodabalapur et al., *J. Applied Physics*, Vol. 80 (12), December 1996, p. 6954.

Figure 8:
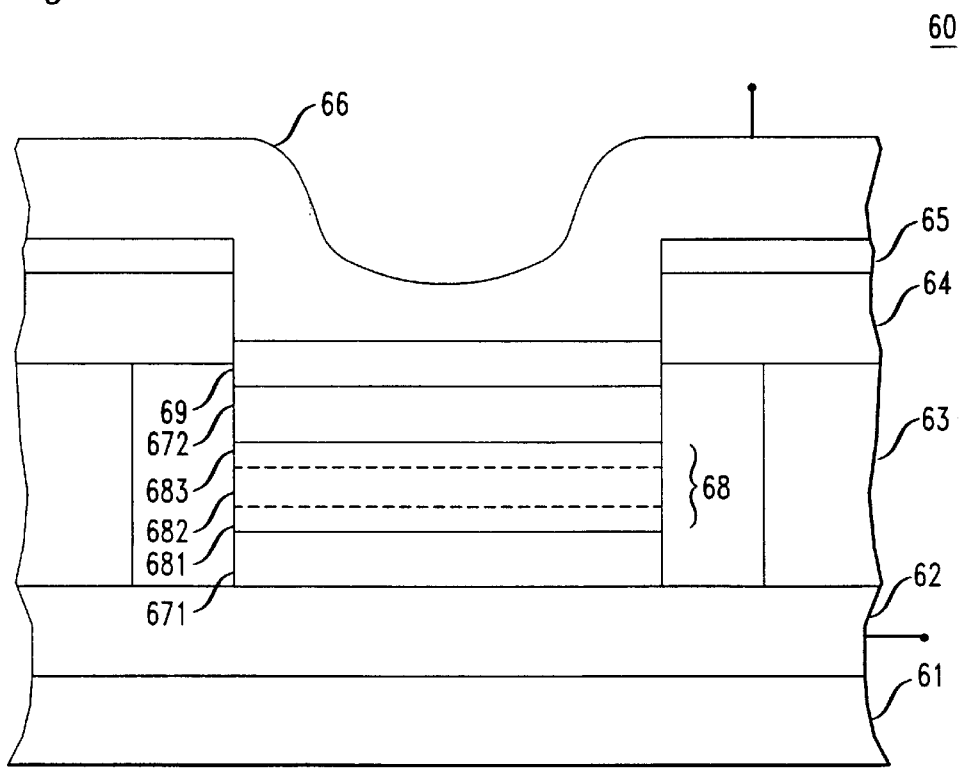

FIG. 8 schematically depicts a further exemplary embodiment of the invention. The laser of FIG. 8 is substantially like the laser of FIG. 6, except that the former comprises two (or possibly more) dopants in the core layer of the waveguide. The dopants are spatially separated, exemplarily by more than about 10 nm. For example, core layer 68 comprises a first sublayer 681 that comprises a first dopant (e.g., a dye such as magnesium phthalocyanine; this dye is available, for instance, from Aldrich Chemical Company, Inc.), a second sublayer 682 that is essentially undoped and is more than 10 nm thick, and a third sublayer 683 that is doped with, e.g., pentacene. By providing a compound core with 2 or more spatially separated doped sublayers it is possible to increase the effective photon residence time in the optical cavity, and consequently to further lower the threshold power density for lasing.

Figure 9:
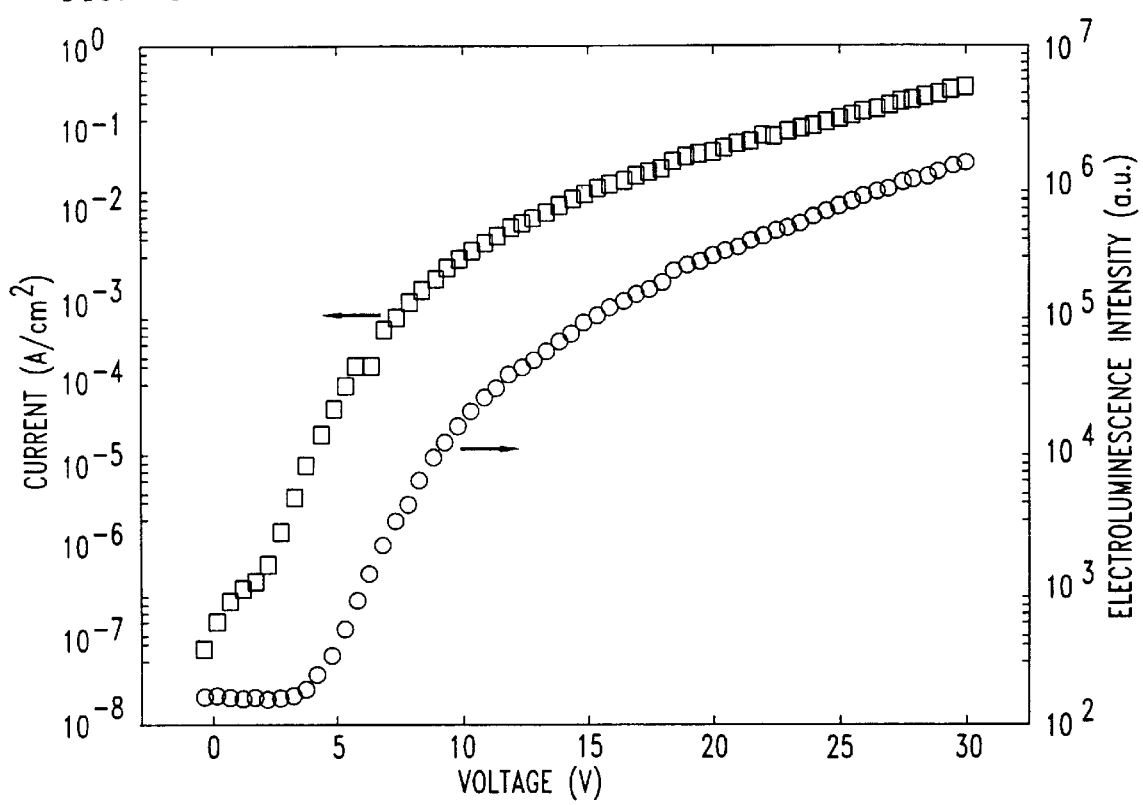
FIG. 9 shows electrical and electroluminescence data of an exemplary organic layer combination.

It will be understood that the embodiments of FIGS. 8 and 9 can be combined into a still further embodiment.

The invention claimed is:

1. Article comprising a unitary solid state source of electromagnetic radiation, said source comprising a layer structure that comprises a multiplicity of layers, including two spaced apart conductor layers with light-emissive first organic material therebetween, and further comprising contacts for causing an electrical current to flow between said conductor layers, such that incoherent electromagnetic radiation of a first wavelength is emitted from said light-emissive first organic material;

CHARACTERIZED IN THAT a) the layer structure further comprises an optical waveguide comprising a first and a second cladding region with a core region therebetween, with the optical waveguide disposed such that at least some of said incoherent electromagnetic radiation of the first wavelength is received by the optical waveguide;

b) said core region comprises a layer of second organic material selected to absorb said incoherent electromagnetic radiation of the first wavelength, and to emit coherent electromagnetic radiation of a second wavelength, longer than the first wavelength, in response to said absorbed incoherent electromagnetic radiation.

2. Article according to claim 1, wherein said layer structure is disposed on a substrate, with said layer of light-emissive first organic material being parallel to, and spaced from, said layer of second organic material.

3. Article according to claim 2, further comprising a distributed feedback grating selected to facilitate emission of electromagnetic radiation of the second wavelength.

4. Article according to claim 2, further comprising two spaced apart distributed Bragg reflectors selected to facilitate emission of electromagnetic radiation of the second wavelength.

5. Article according to claim 2, wherein said optical waveguide comprises a photonic bandgap structure selected to facilitate emission of electromagnetic radiation of the second wavelength.

6. Article according to claim 5, wherein said photonic bandgap structure comprises a multiplicity of spaced apart essentially identical features in a cladding layer.

7. Article according to claim 1, wherein said layer of second organic material comprises an organic matrix material and an organic dopant material, with the organic matrix material selected to absorb said electromagnetic radiation of first wavelength and to transfer a resulting molecular excitation to said organic dopant material such that excited dopant material results, with said excited dopant material emitting said electromagnetic radiation of second wavelength.

8. Article according to claim 7, wherein said layer of the second organic material comprises a first, second and third sub-layer, with the first and third sublayer comprising the matrix material, doped respectively with a first organic dopant material and a second organic dopant material, and the second sublayer is essentially free of said first and second organic dopant material and is disposed between said first and third sublayers, the first and second organic dopant materials selected to result in an increased effective photon residence time in the layer of second organic material.

9. Article according to claim 2, further comprising a dielectric multilayer stack disposed between the substrate and a substantially transparent conductor layer.

10. Article according to claim 2, wherein the unitary solid state source of electromagnetic radiation is a microdisk laser having substantially circular symmetry with respect to a direction normal to the substrate.

11. Article according to claim 2, wherein the unitary solid state source of electromagnetic radiation is a planar waveguide laser.

12. Article according to claim 2, wherein the layer of second organic material is disposed between said spaced apart conductor layers.

13. Article according to claim 2, wherein the layer of second organic material is disposed between the substrate and the conductor layer that is closest to the substrate.

* * * * *